US006483168B1

(12) United States Patent
Chiu

(10) Patent No.: US 6,483,168 B1
(45) Date of Patent: Nov. 19, 2002

(54) INTEGRATED CIRCUIT HAVING RESISTOR FORMED OVER EMITTER OF VERTICAL BIPOLAR TRANSISTOR

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/952,593

(22) Filed: Sep. 13, 2001

(51) Int. Cl.$^7$ .............................................. H01L 29/00

(52) U.S. Cl. ...................... 257/539; 257/538; 257/572; 257/577; 330/307; 330/311; 330/292; 330/265

(58) Field of Search ................................ 257/536, 537, 257/538, 539, 572, 577, 576, 581, 754; 330/292, 311, 307, 265, 263, 267

(56) References Cited

U.S. PATENT DOCUMENTS

| | | | |
|---|---|---|---|
| 3,644,850 A | 2/1972 | Ho .............................. 333/73 |
| 4,485,393 A | * 11/1984 | Kumamaru et al. ......... 257/536 |
| 4,710,791 A | 12/1987 | Shirato et al. ............ 357/23.13 |
| 5,525,831 A | 6/1996 | Ohkawa et al. .............. 257/543 |
| 5,565,367 A | 10/1996 | Lee ................................. 437/6 |
| 5,661,324 A | 8/1997 | Fournel et al. ............... 257/379 |
| 5,661,332 A | 8/1997 | Nakamura et al. ........... 257/536 |
| 5,670,819 A | 9/1997 | Yamaguchi ................... 257/536 |
| 5,815,051 A | 9/1998 | Hamasaki et al. ........... 333/172 |
| 5,895,960 A | 4/1999 | Fritz et al. .................... 257/359 |
| 5,977,610 A | 11/1999 | Chiu ........................... 257/538 |

\* cited by examiner

Primary Examiner—Nathan J. Flynn
Assistant Examiner—Victor A. Mandala, Jr.
(74) Attorney, Agent, or Firm—Girard & Equitz LLP

(57) ABSTRACT

An integrated circuit including a resistor that at least partially overlies a first tub of semiconductor material of a first polarity, where the first tub is formed in a second tub of semiconductor material having the opposite polarity, and the second tub is formed in a semiconductor substrate having the first polarity. The second tub forms the base of a vertical bipolar transistor, the first tub forms the emitter of the transistor, and the substrate forms the collector of such transistor. Where the vertical transistor is a PNP transistor, the first tub is the emitter and consists of P-type semiconductor material, the second tub is the base, and the substrate is the collector. Preferably, the resistor is a strip of polysilicon or a set of multiple, series-connected polysilicon segments. Typically, the integrated circuit is an amplifier and the resistor is a gain-setting resistor. In some embodiments, the resistor extends between a first node and a second node (whose potential varies in response to changes in the input signal), and the resistor is implemented with double bootstrapping, in the sense that the first tub is coupled to a third node of the integrated circuit whose potential changes (in response to a change in the input signal) in such a direction as to pull the potential at the second node in a desired direction and the second tub is coupled to a fourth node whose also potential changes (in response to a change in the input signal) in such a direction as to pull the potential at the second node in a desired direction, without significant current leakage from the first tub to the substrate. For example, the integrated circuit can be (or include) a high-speed cascode amplifier, the third node can be the amplifier's output node, and the fourth node can be the base of a bipolar transistor of a cascode Darlington push-pull output stage of the amplifier.

21 Claims, 7 Drawing Sheets

US 6,483,168 B1

INTEGRATED CIRCUIT HAVING RESISTOR FORMED OVER EMITTER OF VERTICAL BIPOLAR TRANSISTOR

BACKGROUND OF THE INVENTION

1. Field of the Invention

The present invention relates to integrated circuit implementations of high-speed amplifiers, and more specifically to a preferred implementation of a gain-setting resistor in a high-speed amplifier integrated circuit.

2. Description of the Related Art

FIG. 1 is a schematic diagram of a high-speed cascode amplifier for driving a cathode ray tube (CRT) of a display device (e.g., an HDTV CRT). The amplifier has an input buffer stage, a cascode gain stage, and a cascode Darlington push-pull output stage biased at Class B for driving the cathode of a CRT. The circuit asserts amplified output potential Vout at an output node in response to input potential Vin, when biased by bias potential Vb (when supply voltage Vcc–Vee is applied across its top and bottom rail). The FIG. 1 amplifier includes cathode current detection circuitry (including PNP transistors X10 and X12 and resistors R12 and R13, connected as shown) from which an output signal ($I_{out}$) indicative of the cathode current can be drawn (by circuitry not shown in FIG. 1) from node T of FIG. 1.

The FIG. 1 amplifier is typically implemented as an integrated circuit (or portion of an integrated circuit), with some or all of its resistors comprising layers of polysilicon over a layer of field oxide (with a substrate of P-type semiconductor material under the field oxide layer). Such an integrated circuit implementation will be assumed in the following description.

In FIG. 1, resistors RC1 and RC2 are connected in series between nodes X and Y. Node X is coupled to the top rail, which is at potential Vcc. Node Y is coupled to the base of transistor X7, to the collector of transistor X4, and to one end of resistor R8.

Supply voltage (Vcc–Vee) is typically a high voltage (e.g., 145 volts), and input potential Vin typically varies rapidly during operation.

In typical integrated circuit implementations of the FIG. 1 amplifier, each of resistors RC1 and RC2 comprises a polysilicon strip (or multiple polysilicon strips connected in series) over a layer of field oxide, with a substrate of P-type semiconductor material under the field oxide layer. FIG. 2 is a diagram of one such implementation of portion 2 (including resistors RC1 and RC2) of FIG. 1. As shown in FIG. 2, resistor RC1 comprises polysilicon strips RS1 and RS2 and metal connector M2 which connects strip RS1 with strip RS2. Resistor RC2 comprises polysilicon strips RS3 and RS4 and metal connector M4 which connects strip RS3 with strip RS4. Metal contact M1 (which is node X of FIG. 1) is coupled between one end of resistor RC1 and the top rail of FIG. 1. Metal connector M3 connects the other end of resistor RC1 with one end of resistor RC2. Metal contact M5 (which is node Y of FIG. 1) is coupled between the other end of resistor RC2 and the base of transistor X7 (shown in FIG. 1).

A field oxide layer (not shown in FIG. 2, to allow substrate 3 to be shown) is deposited on the exposed upper surface of substrate 3. The four parallel strips RS1, RS2, RS3, and RS4 of polysilicon are deposited on the oxide layer, and metal connectors M2, M3, and M4 (and metal contacts M1 and M5) are deposited on the indicated portions of strips RS1–RS4 and the oxide layer.

A limitation of the above-described implementation of resistor RC2 (as a polysilicon resistor having the structure described with reference to FIG. 2) is that the stray capacitance of such polysilicon resistor (over the field oxide on which it is formed) slows down the output transient response of the FIG. 1 amplifier. Thus, the absolute value of the amplifier's gain is necessarily reduced in order to achieve faster transient response (by implementing resistor RC2 with reduced resistance).

U.S. Pat. No. 5,977,610, issued on Nov. 2, 1999 (and assigned to the assignee of the present invention), discloses polysilicon resistor structures other than the structure described with reference to FIGS. 1 and 2. U.S. Pat. No. 5,977,610 describes several ways to form a polysilicon resistor over one tub or multiple tubs of N-type semiconductor material in a substrate of P-type semiconductor material.

FIG. 3 is a schematic diagram of a high-speed cascode amplifier which differs from the FIG. 1 amplifier only in that resistor RC2 is implemented as a polysilicon resistor of one of the types disclosed in U.S. Pat. No. 5,977,610, in order to reduce its stray capacitance over the field oxide on which it is formed, and thus to improve the amplifier's output transient response without reducing the absolute value of its gain. Portion 12 of the FIG. 3 circuit (including resistor RC2, a diode that underlies RC2, and resistor RC1) is implemented as shown in FIG. 4.

As shown in FIG. 4, resistor RC1 is implemented in the same way as in FIG. 2 and the description of its structure will not be repeated with reference to FIG. 4. In FIG. 4, resistor RC2 comprises polysilicon strips RS3 and RS4 and metal connector M4 connecting strip RS3 with strip RS4. Metal connector M3 connects one end of resistor RC2 with one end of resistor RC1. Metal contact M5 (which is node Y of FIG. 3) is coupled between the other end of resistor RC2 and the base of transistor X7 (shown in FIG. 3).

Resistor RC2 of FIG. 4 (and the amplifier of FIG. 3 including it) is manufactured on substrate 3 of P-type semiconductor material. At the location on substrate 3 where resistor RC2 is to be formed, a diode is implemented by forming a layer of N-type semiconductor material 4 on substrate 3 (such as by implanting N-type impurities in a rectangular region of the substrate material and then removing unwanted portions of the N-type semiconductor material). After the initial formation step, layer 4 has uniform (relatively small) thickness, except that it has relatively large thickness at one portion under which metal contact M6 is to be formed (so that layer 4 extends all the way up to contact M6).

After the initial step in forming N-type layer 4 on P-type substrate 3, layer 4 is enlarged by growing an epitaxial layer of N-type semiconductor material over the initially formed N-type material (except for the thick portion of the N-type material on which contact M6 is to be formed) and over a portion of P-type substrate 3 surrounding the outer periphery of the initially formed N-type material. FIG. 4 shows P-type semiconductor substrate material 3 surrounding the outer periphery of completely formed N-type semiconductor layer 4. Completely formed N-type semiconductor layer 4 comprises a large, single tub (well) of N-type semiconductor material in P-type substrate 3.

A field oxide layer is deposited on the exposed upper surfaces of substrate 3 and completely formed tub 4 of circuit portion 12, but not over the portion of tub 4 on which contact M6 is to be formed. The field oxide layer is not shown in FIG. 4 to allow depiction of substrate 3 and tub 4. After deposition of the field oxide layer, parallel polysilicon strips RS1, RS2, RS3, and RS4 are deposited on the field oxide layer. Finally, a pattern of metal (having high electrical conductivity) is deposited on portions of the polysilicon material, on portions of the field oxide layer between the polysilicon strips, and on the bare portion of tub 4, to implement metal contacts and connectors M1, M2, M3, M4, M5, and M6. Thus, the completed resistor RC2 comprises strip RS3 (connected at one end to connector M3 and at the other end to connector M4) and strip RS4 (connected at one end to connector M4 and at the other end to contact M5), overlying tub 4 of N-type semiconductor material. Metal contact M1 of resistor RC1 is coupled to node X (of FIG. 3) so that current can flow from contact M1 through resistor RC1 and connector M3 to one end of polysilicon resistor RC2, and then through strip RS3, connector M4, and strip RS4, to the contact M5 at the opposite end of resistor RC2.

Metal contact M6 is deposited on tub 4 at node Z of FIG. 3. To "bootstrap" tub 4 of FIG. 4 (and thus the FIG. 4 implementation of resistor RC2) to FIG. 3's output node, metal contact M6 (and thus tub 4) is coupled to FIG. 3's output node (which is at the potential $V_{out}$). Such bootstrapping reduces the effect of resistor RC2's stray capacitance over the underlying field oxide layer, causing the leading and trailing edges of the FIG. 3 amplifier's response to time-varying input potential $V_{in}$ (e.g., a square wave potential $V_{in}$) to have shorter rise and fall times than would the FIG. 1 amplifier's response to the same input potential. This is apparent, for example, from FIGS. 7 and 8 which show the response of the FIG. 1 amplifier (and the FIG. 3 amplifier) to a square wave potential $V_{in}$, when such amplifier is connected as is amplifier 20 of FIG. 9.

FIG. 9 is a schematic diagram of a circuit for testing a cathode driver amplifier 20, which can be any of the amplifiers of FIG. 1, 3, and 5. The output node of amplifier 20 is coupled through resistor R1 to the cathode of CRT display device 21, the input node of amplifier 20 is coupled through resistor R2 to voltage source 22, voltage source 23 holds amplifier 20's top rail at $V_{cc}$ volts above ground, and voltage source 24 provides bias potential $V_b$ to amplifier 20. Node T of the amplifier is coupled to sense resistor Rs, so that current $I_{out}$ flows from Node T to ground through the sense resistor Rs.

FIGS. 7 and 8 indicate the result of operating the FIG. 9 circuitry with amplifier 20 implemented as the circuit of each of FIGS. 1, 3, and 5. Curve 31 of FIG. 7 is a graph of the output potential (Vout) of the FIG. 3 circuit as a function of time, in response to a square wave input potential Vin (having period 300 nsec), with $V_{cc}-V_{ee}$=145 volts, $V_b-V_{ee}$=8 volts, and $V_{in}-V_{ee}$ varying between 2 volts and 0 volts. Curve 30 of FIG. 7 is a graph of the output potential (Vout) of the FIG. 1 circuit as a function of time, under the same conditions and in response to the same square wave input potential Vin. Curve 32 of FIG. 7 is a graph of the output potential (Vout) of the FIG. 5 circuit (to be described below) as a function of time, under the same conditions and in response to the same square wave input potential Vin. FIG. 8 is an enlarged detail of a portion of each of the three curves of FIG. 7.

As is apparent from FIGS. 7 and 8, the leading and trailing edges of curve 31 desirably have shorter rise and fall times than do the corresponding edges of curve 30. In general, the leading and trailing edges of the FIG. 3 amplifier's response to time-varying input potential $V_{in}$ have shorter rise and fall times than do the FIG. 1 amplifier's response to the same input potential.

However, the FIG. 4 implementation of resistor RC2 is inferior in one respect to the FIG. 2 implementation of resistor RC2. This is due to the fact that since resistor RC2 (in the FIG. 4 implementation) is formed over a large N-tub-to-P-substrate diode, there is typically a leakage resistance (labeled as "R_Leak" in FIG. 3) between contact M6 and substrate 3 through which a significant leakage current can flow, especially when the output potential $V_{out}$ is much greater than the bottom rail potential $V_{ee}$ (e.g., when $V_{out}$ is close to $V_{cc}$, and $V_{cc}-V_{ee}$=145 volts).

FIG. 10 is a graph of the DC response of the FIG. 1 circuit (at each of and the output node) measured while operating the FIG. 9 circuitry with amplifier 20 implemented as in FIG. 1 (and resistor RC2 as in FIG. 2). Specifically, curve 34 of FIG. 10 is the current flowing from FIG. 1's output node (at the output potential $V_{out}$) through resistor R1 of FIG. 9, as $V_{in}$ slowly rises to $V_{ee}$+1.95 volts from $V_{ee}$ volts (with $V_{cc}-V_{ee}$=145 volts, and $V_b-V_{ee}$=8 volts). Curve 35 of FIG. 10 is the current $I_{out}$ flowing from node T of FIG. 1 through resistor Rs of FIG. 9, as $V_{in}$ slowly rises to $V_{ee}$+1.95 volts from $V_{ee}$ volts (with $V_{cc}-V_{ee}$=145 volts, and $V_b-V_{ee}$=8 volts).

FIG. 11 is a graph of the DC response of the FIG. 3 circuit (at each of node T and the output node) measured while operating the FIG. 9 circuitry with amplifier 20 implemented as in FIG. 3 (and resistor RC2 as in FIG. 4). Curve 44 of FIG. 11 is the current flowing from FIG. 3's output node (at the output potential $V_{out}$) through resistor R1 of FIG. 9, as $V_{in}$ slowly rises to $V_{ee}$+1.95 volts from $V_{ee}$ volts (with $V_{cc}-V_{ee}$=145 volts, and $V_b-V_{ee}$=8 volts). Curve 45 of FIG. 11 is the current $I_{out}$ that flows from node T of FIG. 3 through resistor Rs of FIG. 9, in response to the same slow rise of $V_{in}$.

FIG. 10 shows that the ratio of the cathode current flowing from FIG. 1's output node (through resistor R1) to the current $I_{out}$ flowing from node T of FIG. 1 (through resistor Rs) remains nearly constant for all values of input potential $V_{in}$. However, FIG. 11 shows that the ratio of the cathode current flowing from FIG. 3's output node (through resistor R1) to the current Iout flowing from node T of FIG. 3 (through resistor Rs) depends on the value of input potential $V_{in}$, with the ratio being significantly greater for large values than for small values of potential $V_{in}$. Thus, the current Iout drawn from node T of FIG. 3 is not accurately indicative of the cathode current flowing from FIG. 3's output node (through resistor R1) to the CRT display device, whereas the current Iout drawn from node T of FIG. 1 is accurately indicative of the cathode current flowing from FIG. 1's output node to the CRT display device. The error inherent in the FIG. 3 circuit's ability to indicate the cathode current flowing from its output node to a CRT display device results from leakage of some of the cathode current through the above-discussed leakage resistance R_Leak.

Until the present invention, was not known how to implement a gainsetting resistor in an amplifier of the type shown in FIGS. 1 and 3 to allow the amplifier to respond rapidly to rapid variations in its input signal (as can the FIG. 4 implementation of resistor RC2) while also allowing accurate detection of the cathode current drawn from the amplifier's output node by measuring a current (other than the cathode current) drawn from a node (other than the amplilier's output node ) as can the FIG. 2 implementation of resistor RC2'.

SUMMARY OF THE INVENTION

In a class of embodiments, the invention is an integrated circuit including a resistor (preferably a strip of polysilicon, or multiple, series connected polysilicon segments) that overlies (at least partially) a first tub of semiconductor material of a first polarity (i.e., N-type or P-type material), where the first tub is formed in a second tub of semiconductor material having the opposite polarity, and the second tub of semiconductor material is formed in a semiconductor substrate having the first polarity. The second tub forms the base of a vertical bipolar transistor, the first tub forms the emitter of the transistor, and the substrate forms the collector of such transistor. In one embodiment, the transistor is a vertical PNP transistor, the first tub is the transistor's emitter and consists of P-type semiconductor material, the second tub is the transistor's base, and the substrate is the transistor's collector. In preferred embodiments, the integrated circuit is an amplifier and the resistor is a gain-setting resistor.

In typical embodiments, the resistor of the inventive integrated circuit extends between a first node (whose potential typically varies in response to changes in an input signal) and a second node (whose potential varies in response to changes in the input signal), and the first tub is bootstrapped in the sense that it is coupled to a third node of the integrated circuit whose potential changes (in response to a change in the input signal) in such a direction as to pull the potential at the second node in a desired direction. In preferred embodiments, the resistor extends between a first node of the integrated circuit and a second node (whose potential varies in response to changes in the input signal), and the resistor is implemented with double bootstrapping in the sense that the first tub is coupled to a third node of the integrated circuit whose potential changes (in response to a change in the input signal) in such a direction as to pull the potential at the second node in a desired direction and the second tub is coupled to a fourth node of the integrated circuit whose potential also changes (in response to a change in the input signal) in such a direction as to pull the potential at the second node in a desired direction, without significant current leakage from the first tub to the substrate. For example, the third node can be the output node of a high-speed cascode amplifier, and the fourth node can be the base of a bipolar transistor of a cascode Darlington push-pull output stage of such high-speed cascode amplifier).

In a class of preferred embodiments, the invention is a high-speed cascode amplifier (for example, of the type shown in FIG. 5), the gain-setting resistor is coupled to a second resistor, and the second resistor is coupled to the top rail. The top rail potential is fixed, and bootstrapping is implemented by coupling the first tub to the amplifier's output node. Preferably also, the second tub is coupled to another node of the amplifier (e.g., to the base of a bipolar transistor of a cascode Darlington push-pull output stage of the amplifier).

BRIEF DESCRIPTION OF THE DRAWINGS

FIG. 2 does not show the field oxide layer on which polysilicon resistors RC1 and RC2 are formed.

FIG. 4 does not show first tub of semiconductor material of a first polarity (i.e., N-type or P-type material the field oxide layer on which polysilicon resistors RC1 and RC2 are formed.

FIG. 6 does not show the field oxide layer on which polysilicon resistors RC1 and RC2 are formed.

DETAILED DESCRIPTION OF THE PREFERRED EMBODIMENTS

Figure 7:
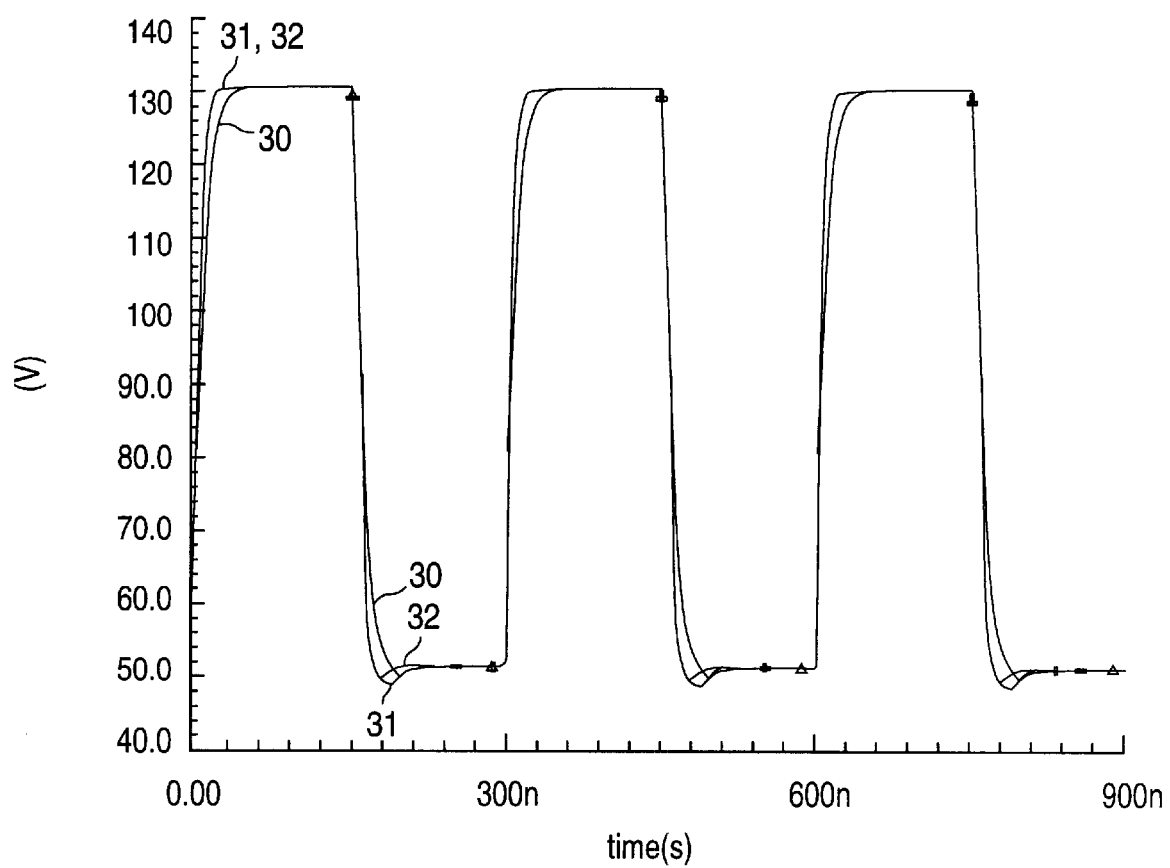
FIG. 7 is a graph, in which curve 30 is the output potential of the FIG. 1 circuit, curve 31 is the output potential of the FIG. 3 circuit, and curve 32 is the output potential of the FIG. 5 circuit, each in response to the same square wave input potential.
Figure 8:
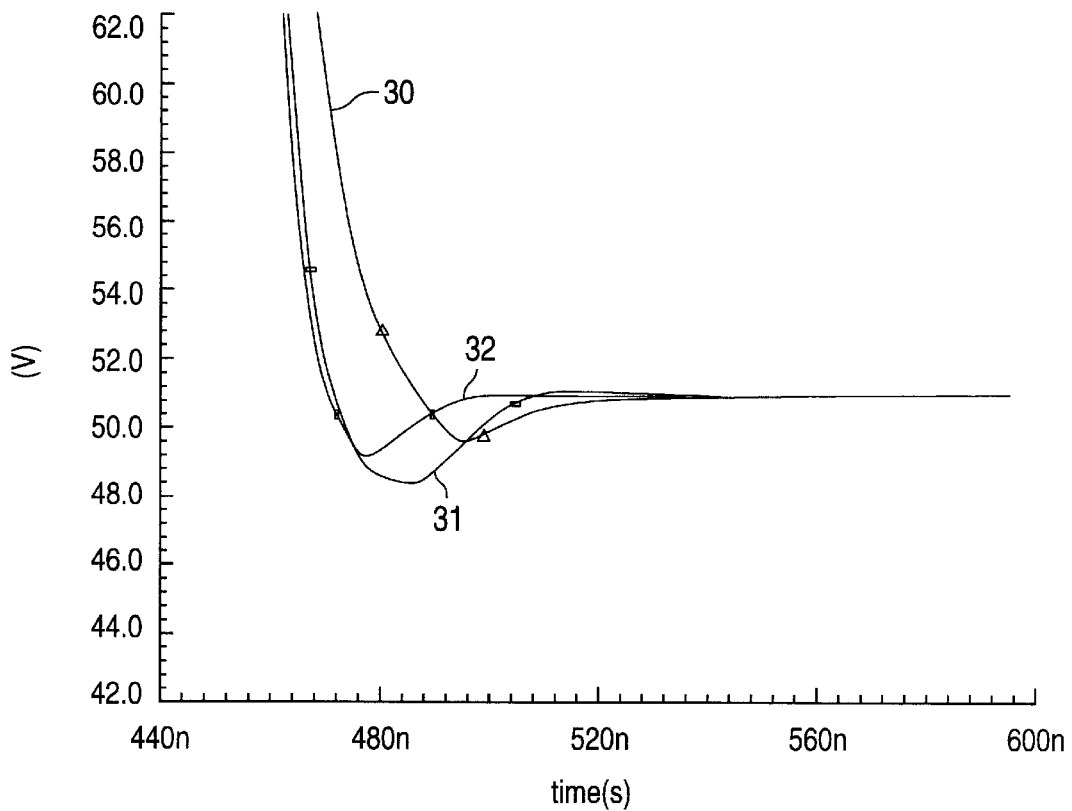
FIG. 8 is an enlarged detail of a portion of each of the three curves of FIG. 7.

A preferred embodiment of the invention will be described with reference to FIGS. 5 and 6. Signals generated during operation of this embodiment of the invention will be discussed with reference to FIGS. 7, 8, and 12.

Figure 1:
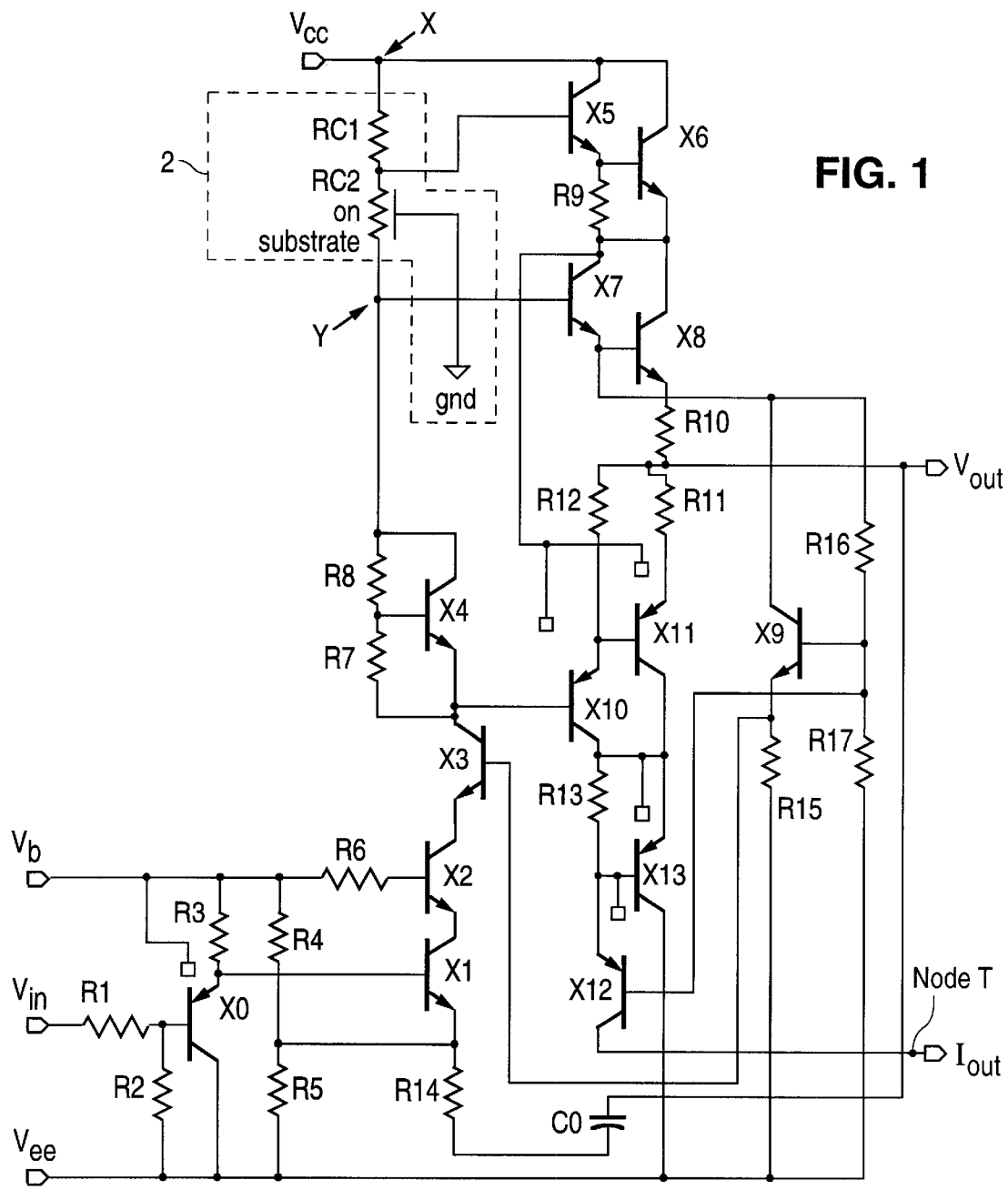
FIG. 1 is a schematic diagram of a cascode amplifier having a cascode Darlington push-pull output stage.
Figure 5:
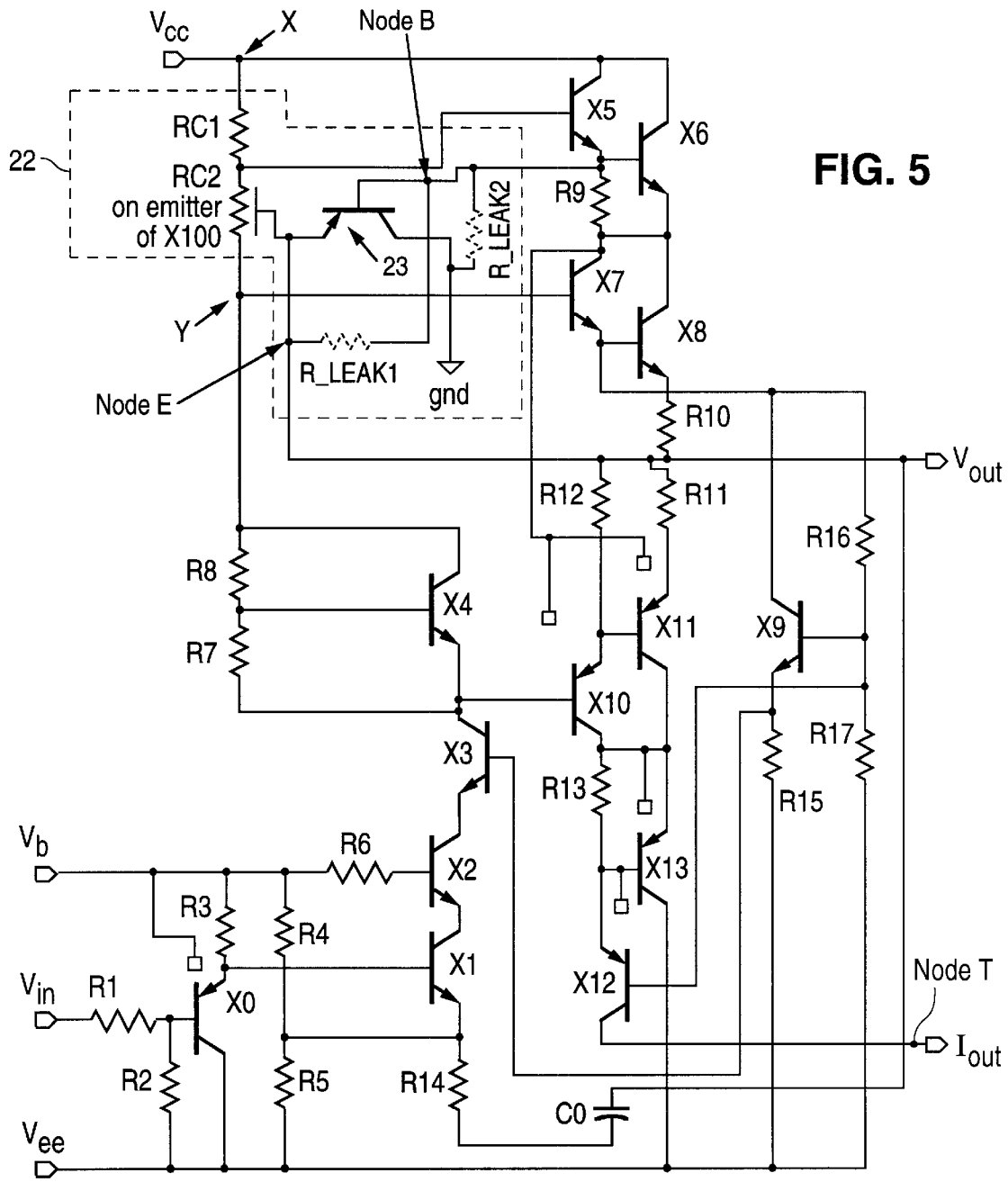
FIG. 5 is a schematic diagram of another variation on the amplifier of FIG. 1, in which resistor RC2 is implemented in accordance with the invention.

FIG. 5 is a schematic diagram of a high-speed cascode amplifier which differs from the FIG. 1 amplifier only in that resistor RC2 is implemented as a polysilicon resistor in accordance with the present invention, in order to reduce its stray capacitance over the field oxide on which it is formed, and thus to improve the amplifier's output transient response without reducing the absolute value of its gain. Portion 22 of the FIG. 5 circuit (including resistors RC1 and RC2, and a transistor 23 which underlies resistors RC1 and resistor RC2) is implemented as shown in FIG. 6. Transistor 23 is a vertical PNP transistor.

Figure 2:
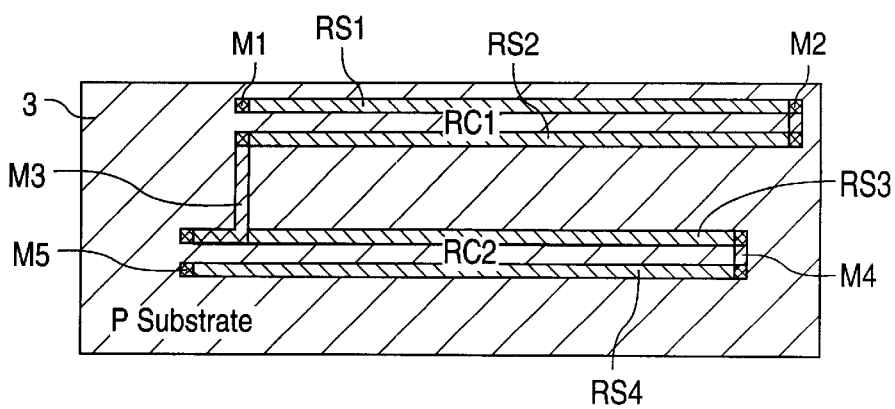
FIG. 2 is a top view of a conventional implementation of circuitry 2 (including resistors RC1 and RC2) of FIG. 1.
Figure 6:
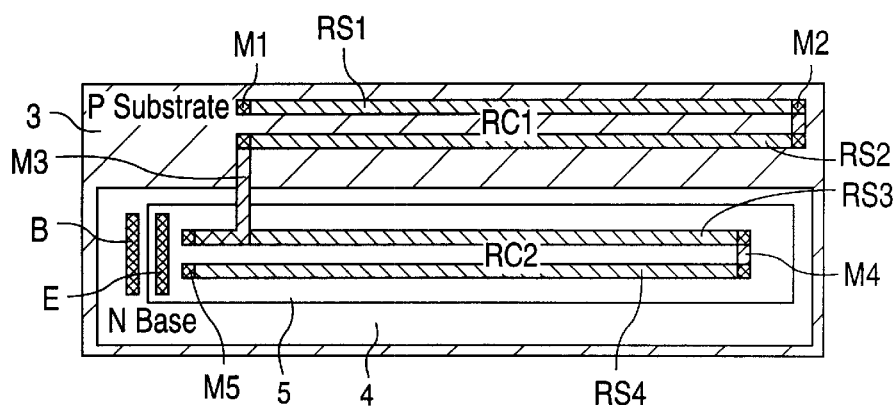
FIG. 6 is a top view of an implementation of circuitry 22 (including resistors RC1 and RC2) of FIG. 5, in accordance with the invention.

As shown in FIG. 6, resistor RC1 is implemented in the same way as in FIG. 2 and the description of its structure will not be repeated with reference to FIG. 6. In FIG. 6, resistor RC2 comprises polysilicon strips RS3 and RS4 and metal connector M4 connecting strip RS3 with strip RS4. Metal connector M3 connects one end of resistor RC2 with one end of resistor RC1. Metal contact M5 (which is node Y of FIG. 5) is coupled between the other end of resistor RC2 and the base of transistor X7 (shown in FIG. 5). Resistor RC2 of FIG. 6 (and the amplifier of FIG. 5 including it) is manufactured on substrate 3 of P-type semiconductor material. At the location on substrate 3 where resistor RC2 is to be formed, the process of forming transistor 23 begins by forming a layer of N-type semiconductor material 4 on substrate 3 (such as by implanting N-type impurities in a rectangular region of the substrate material and then removing unwanted portions of the N-type semiconductor material). After the initial formation step, layer 4 has uniform (relatively small) thickness except that it has relatively large thickness at the portion over which metal contact B is to be deposited (so that layer 4 extends all the way up to the expected position of contact B).

After the initial step in forming N-type layer 4 on P-type substrate 3, N-type layer 4 is enlarged by growing an epitaxial layer of N-type semiconductor material over the existing N-type semiconductor material (but not over the thick portion of N-type material over which contact B is to be deposited) and over a portion of P-type substrate 3 surrounding the outer periphery of the existing N-type semiconductor material. Completely formed N-type semiconductor layer 4 comprises a large, single tub (well) of N-type semiconductor material in P-type substrate 3. The completely formed N-type semiconductor layer 4 is the base of transistor 23, and substrate 3 is the collector of transistor 23. FIG. 6 shows P-type semiconductor substrate material 3 surrounding the outer periphery of completely formed N-type semiconductor layer 4.

Alternatively, the tub of N-type semiconductor material 4 is formed in a single step on substrate 3 (to form the base of transistor 23), and a tub of P-type semiconductor material 5 is then formed on the tub of N-type material 4 (to form the emitter of transistor 23).

At the location on layer 4 where resistor RC2 is to be formed, the emitter of transistor 23 is implemented by forming a layer of P-type semiconductor material 5 on layer 4 (such as by implanting P-type impurities in a rectangular region of layer 4 and then removing unwanted portions of the P-type semiconductor material). After the initial formation step, layer 5 has uniform (relatively small) thickness except that it has relatively large thickness at the portion over which metal contact E is to be deposited (so that layer 5 extends all the way up to the expected position of contact E). After the initial step in forming P-type layer 5 on N-type material 4, P-type layer 5 is enlarged by growing an epitaxial layer of P-type semiconductor material over the existing P-type material (but not over the thick portion of P-type material over which contact E is to be deposited) and over a portion of N-type tub 4 surrounding the outer periphery of the existing P-type semiconductor material of layer 5. Completely formed P-type semiconductor layer 5 comprises a large, single tub (well) of P-type semiconductor material in N-type tub 4. The completely formed P-type semiconductor layer 5 is the emitter of transistor 23.

Figure 6A:
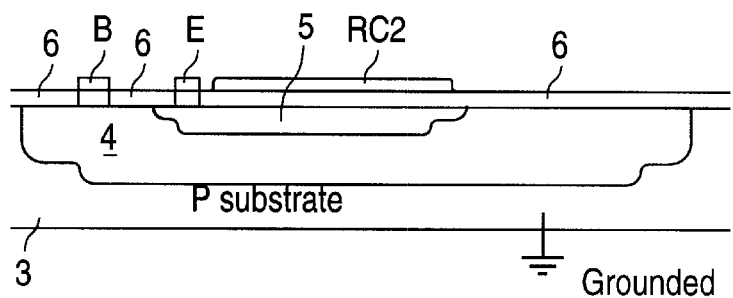
FIG. 6A is a simplified side cross-sectional view of the circuitry of FIG. 6.

A field oxide layer (layer 6 of FIG. 6A) is deposited on the exposed upper surfaces of substrate 3 and completely formed tubs 4 and 5 of circuit portion 22, but not over the portions of tubs 4 and 5 on which contacts B and E are to be formed. FIG. 6A shows field oxide layer 6 deposited on substrate 3 and tubs 4 and 5, except for those portions of tubs 4 and 5 on which contacts B and E have been formed. The field oxide layer is not shown in FIG. 6 to allow depiction of substrate 3 and tubs 4 and 5.

After deposition of the field oxide layer, parallel polysilicon strips RS1, RS2, RS3, and RS4 are deposited on the field oxide layer. Finally, a pattern of metal (having high electrical conductivity) is deposited on portions of the polysilicon material, on portions of the field oxide layer between the polysilicon strips, and on the bare portions of tubs 4 and 5, to implement metal contacts and connectors M1, M2, M3, M4, M5, B and E. Thus, the completed resistor RC2 comprises strip RS3 (connected at one end to connector M3 and at the other end to connector M4) and strip RS4 (connected at one end to connector M4 and at the other end to contact M5), overlying tub 5 of P-type semiconductor material, which in turn overlies tub 4 of N-type semiconductor material. Metal contact M1 of resistor RC1 is coupled to node X (of FIG. 5) so that current can flow from contact M1 through resistor RC1 and connector M3 to one end of polysilicon resistor RC2, and then through strip RS3, connector M4, and strip RS4, to the contact M5 at the opposite end of resistor RC2.

Metal contact B is deposited on tub 4 at the position corresponding to node B of FIG. 5, and metal contact E is deposited on tub 5 at the position corresponding to node E of FIG. 5. As shown in FIG. 6A, contacts B and E are deposited respectively on tub 4 and tub 5, and resistor RC2 is formed over tub 5 at a location that is laterally displaced from contact E.

To bootstrap both tub 4 and tub 5 of FIG. 6 (and thus "double bootstrap" the FIG. 6 implementation of resistor RC2 ), contact B (and thus tub 4) is coupled to the base of NPN bipolar transistor X6 (of the cascode Darlington push-pull output stage of FIG. 5) and contact E is coupled to FIG. 5's output node (which is at the potential $V_{out}$). Such double bootstrapping reduces the effect of resistor RC2's stray capacitance over the underlying field oxide layer, causing the leading and trailing edges of the FIG. 5 amplifier's response to time-varying input potential $V_{in}$ (e.g., a square wave potential $V_{in}$) to have shorter rise and fall times than would the FIG. 1 amplifier's response to the same input potential. This is apparent, for example, from FIGS. 7 and 8 which show the response of the FIG. 1 amplifier (and the FIG. 5 amplifier) to a square wave potential $V_{in}$, when each such amplifier is connected as is amplifier 20 of FIG. 9. As is apparent from FIGS. 7 and 8, the leading and trailing edges of curve 32 desirably have shorter rise and fall times than do the corresponding edges of curve 30. In general, the leading and trailing edges of the FIG. 5 amplifier's response to time-varying input potential $V_{in}$ have shorter rise and fall times than do the FIG. 1 amplifier's response to the same input potential. Another advantage of the FIG. 6 implementation of resistor RC2 relative to that of the FIG. 4 implementation of resistor RC2 is that the response of FIG. 5 to time-varying input potential $V_{in}$ (e.g., curve 32 of FIGS. 7 and 8) has less overshoot (the amount by which the minimum value of the curve exceeds the lower plateau to which each cycle of the curve settles) and shorter settling time than does the response of FIG. 3 to time-varying input potential $V_{in}$ (e.g., curve 31 of FIGS. 7 and 8).

Vertical PNP transistor 23 has leakage resistance (labeled "R_Leak1" in FIG. 5) between its base and collector (i.e., between tubs 5 and 4), and leakage resistance (labeled "R_Leak2" in FIG. 5) between its base and emitter (i.e., between tub 4 and substrate 3). Transistor 23's leakage resistance R_Leak2 (between N-type tub 4 and P-type substrate 3 of FIG. 6) is the same or nearly the same as the leakage resistance R_Leak between N-type tub 4 and P-type substrate 3 of FIG. 4. Substrate 3 of FIG. 6 is coupled via leakage resistance R_Leak2 to the base of NPN transistor X6, tub 5 is coupled via leakage resistance R_Leak1 to the base of transistor X6, and tub 4 is coupled via leakage resistance R_Leak1 to the output node (at $V_{out}$).

Figure 4:
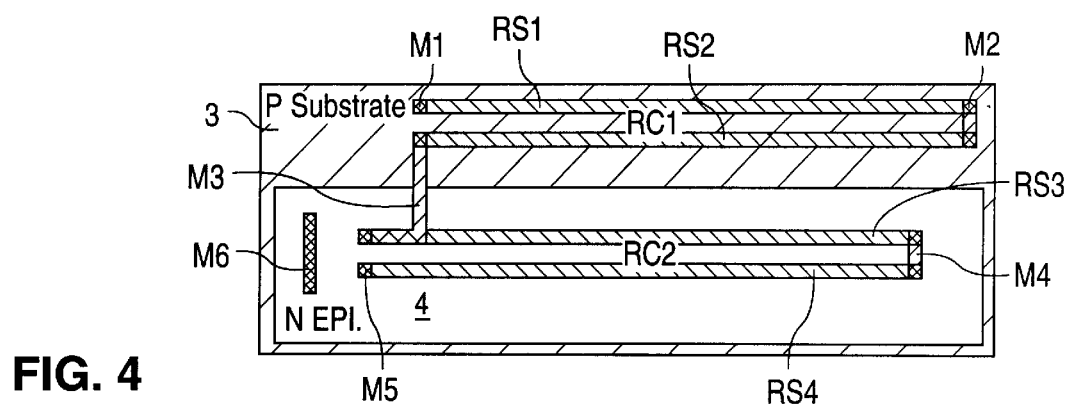
FIG. 4 is a top view of a conventional implementation of circuitry 12 (including resistors RC1 and RC2) of FIG. 3.

Due to its two-tub structure, the FIG. 6 implementation of resistor RC2 is less sensitive to the problem of cathode current leakage (from the amplifier's output node through tubs 5 and 4 to substrate 3) than the FIG. 4 implementation is to the problem of cathode current leakage (from tub 4 of FIG. 4 to substrate 3 of FIG. 4). This important advantage of implementing resistor RC2 as in FIG. 6 (rather than as in FIG. 4) is apparent from comparing FIG. 12 with FIG. 11.

Figure 3:
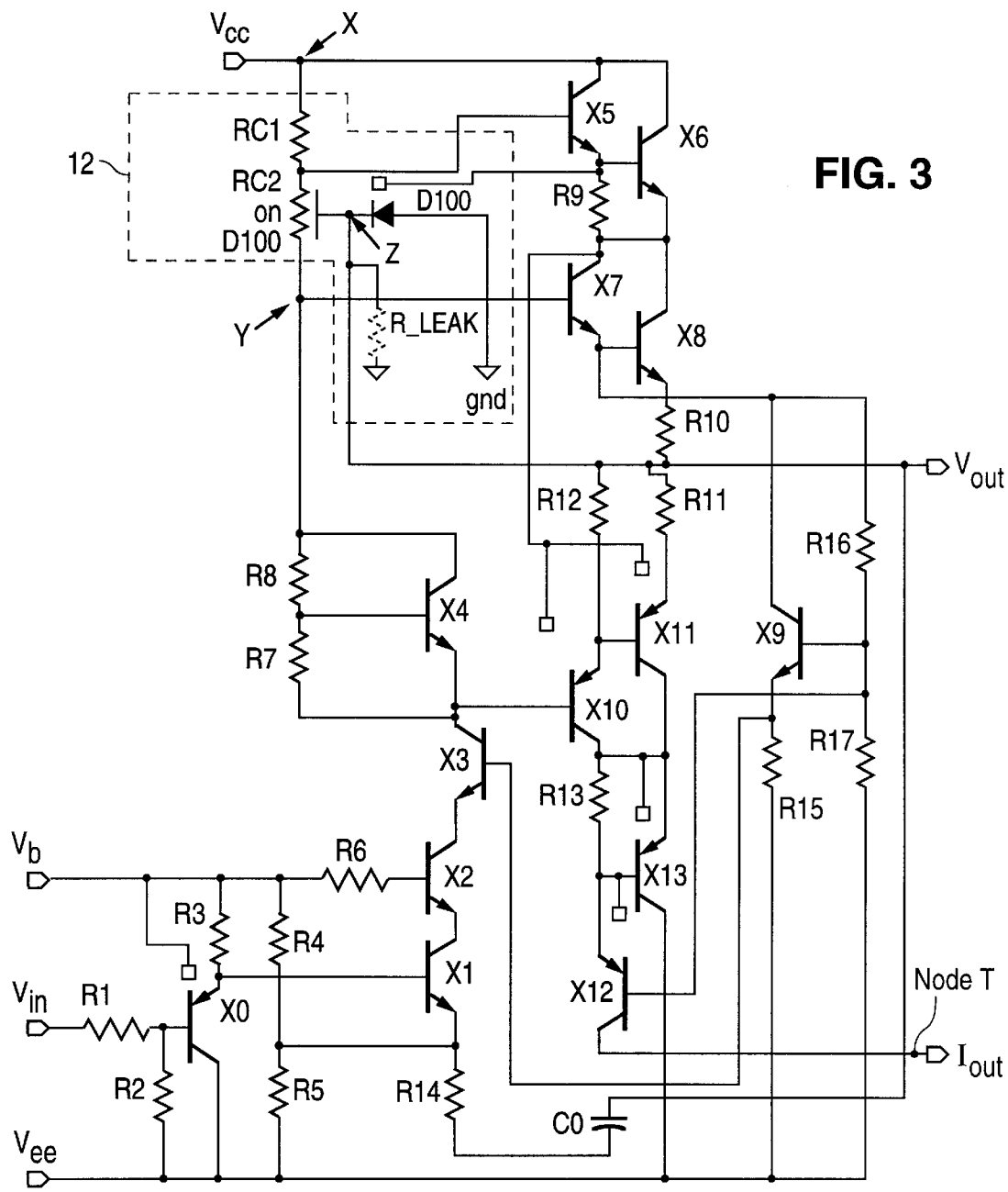
FIG. 3 is a schematic diagram of a variation on the amplifier of FIG. 1, in which resistor RC2 is formed over a tub of N-type semiconductor material in a P-type semiconductor substrate.
Figure 9:
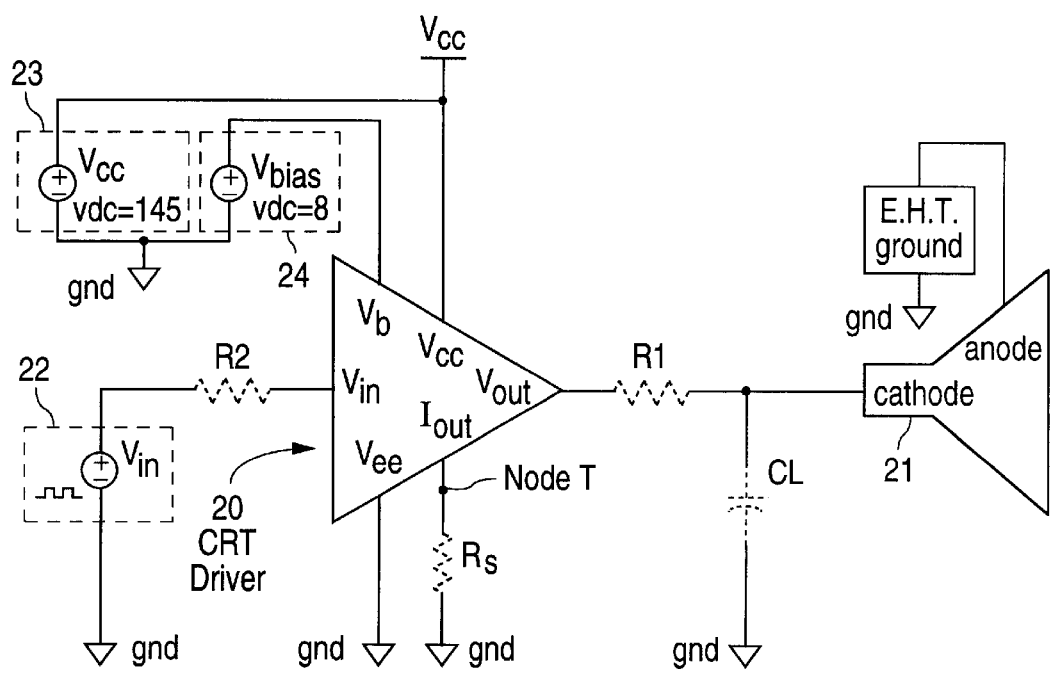
FIG. 9 is a schematic diagram of a circuit for testing any of the amplifiers of FIG. 1, 3, and 5.
Figure 10:
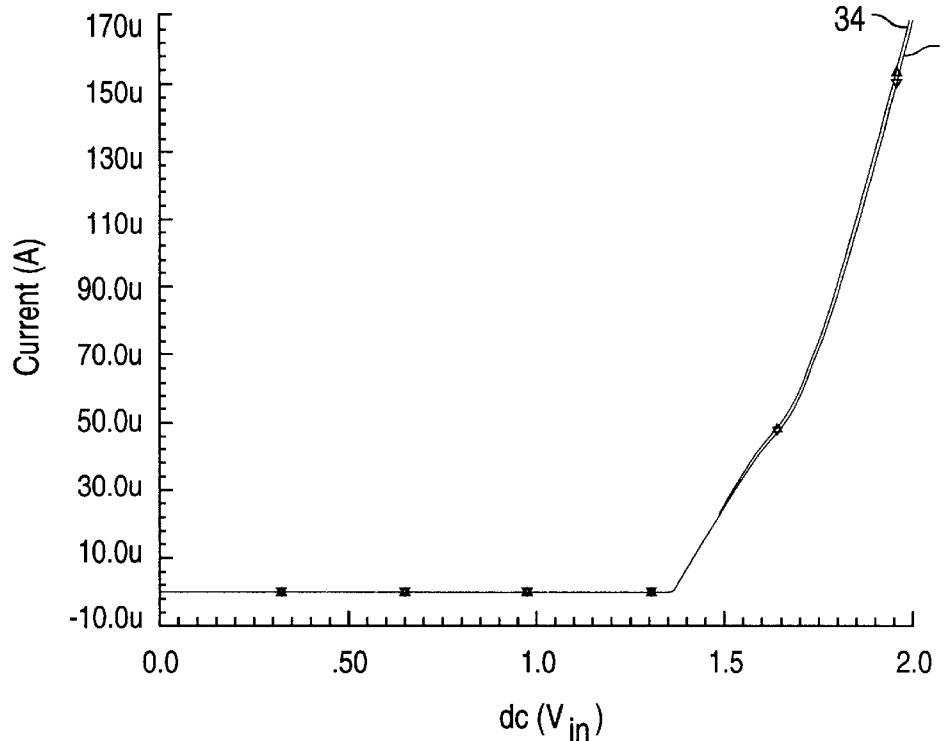
FIG. 10 is a graph, in which curve 34 is the current drawn from the output node of the FIG. 1 circuit, and curve 35 is the current drawn from node T of the FIG. 1 circuit, each in response to a slowly increasing input potential $V_{in}$.
Figure 11:
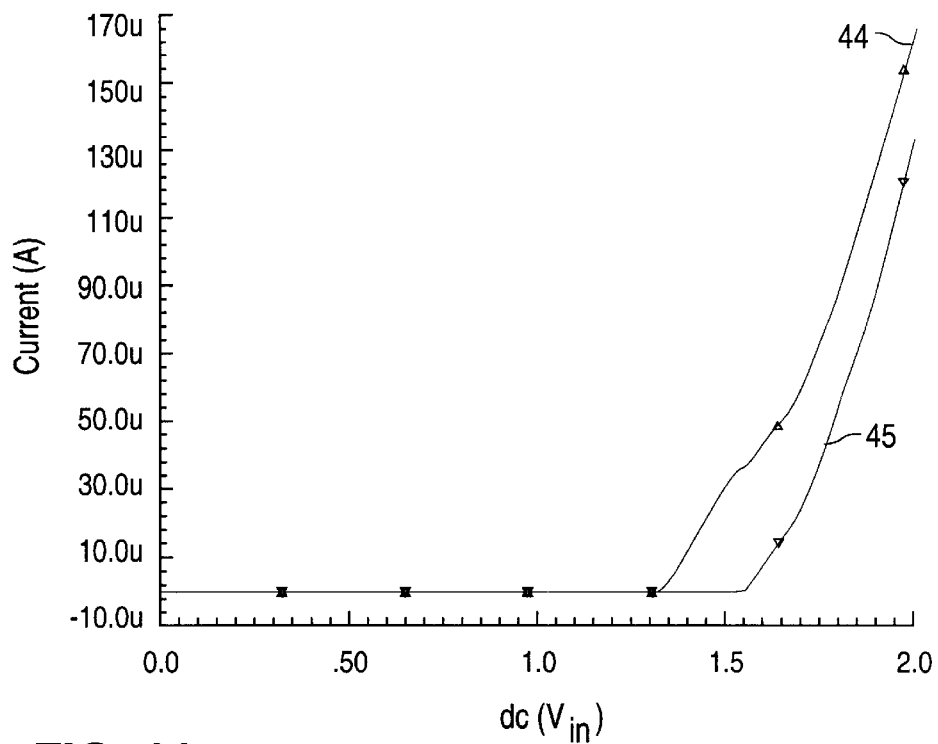
FIG. 11 is a graph, in which curve 44 is the current drawn from the output node of the FIG. 3 circuit, and curve 45 is the current drawn from node T of the FIG. 3 circuit, each in response to a slowly increasing input potential $V_{in}$.

As noted above, curve 34 of FIG. 10 is a graph of the current flowing from FIG. 1's output node (at the output potential $V_{out}$) through resistor R1 of FIG. 9 as $V_{in}$ slowly rises to $V_{ee}+1.95$ volts from $V_{ee}$ volts (with $V_{cc}-V_{ee}=145$ volts, and $V_b-V_{ee}=8$ volts), curve 35 of FIG. 10 is the current $I_{out}$ flowing from node T of FIG. 1 through resistor Rs of FIG. 9 in response to the same slow rise of $V_{in}$, curve 44 of FIG. 11 is the current flowing from FIG. 3's output node (at the output potential $V_{out}$) through resistor R1 of FIG. 9 as $V_{in}$ slowly rises to $V_{ee}+1.95$ volts from $V_{ee}$ volts (with $V_{cc}-V_{ee}=145$ volts, and $V_b-V_{ee}=8$ volts), and curve 45 of FIG. 11 is the current Iout that flows from node T of FIG. 3 through resistor Rs of FIG. 9, in response to the same slow rise of $V_{in}$.

Figure 12:
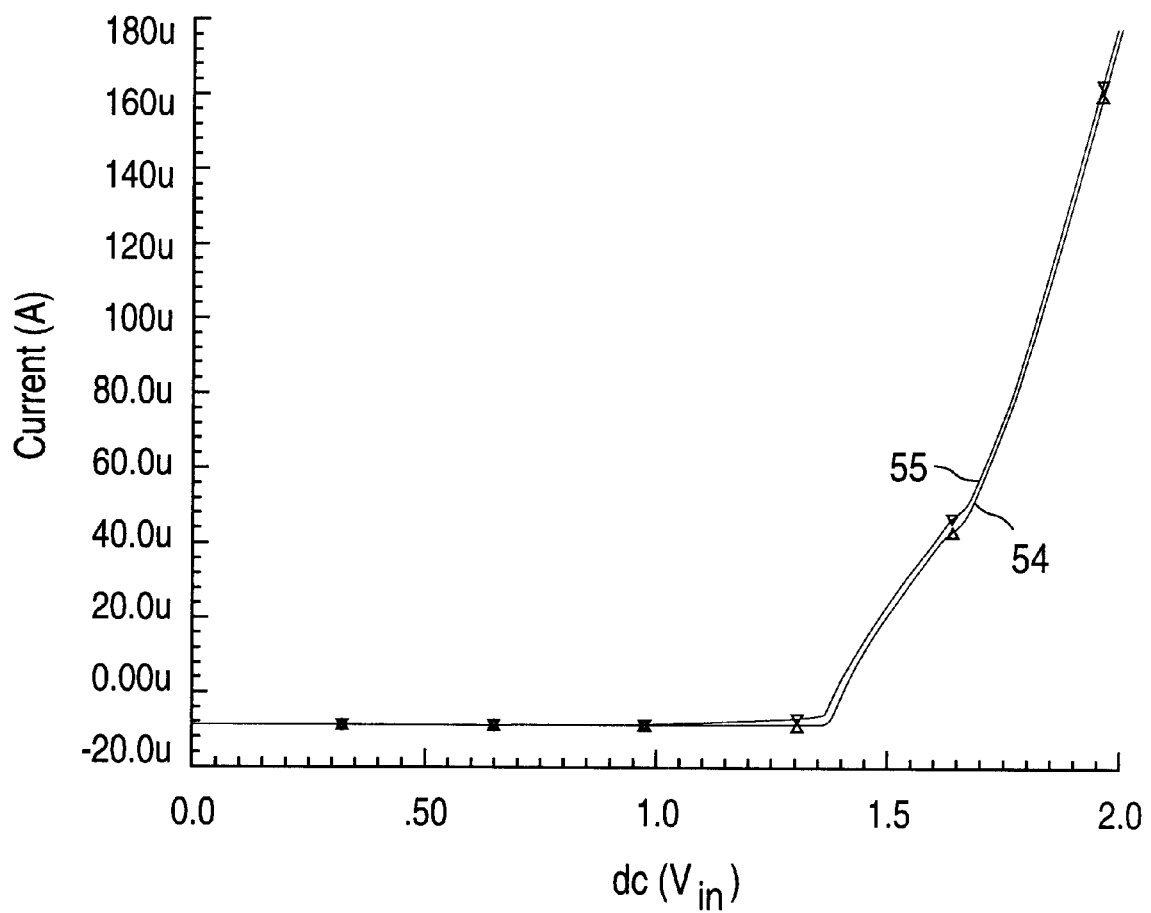
FIG. 12 is a graph, in which curve 54 is the current drawn from the output node of the FIG. 5 circuit, and curve 55 is the current drawn from node T of the FIG. 5 circuit, each in response to a slowly increasing input potential $V_{in}$.

FIG. 12 is a graph of the DC response of the FIG. 5 circuit (at each of node T and the output node) measured while operating the FIG. 9 circuitry with amplifier 20 implemented as in FIG. 5 (and resistor RC2 as in FIG. 6). Curve 54 of FIG. 12 is the current flowing from FIG. 5's output node (at the output potential $V_{out}$) through resistor R1 of FIG. 9, as $V_{in}$ slowly rises to $V_{ee}+1.95$ volts from $V_{ee}$ volts (with $V_{cc}-V_{ee}=145$ volts, and $V_b-V_{ee}=8$ volts). Curve 55 of FIG. 12 is the current $I_{out}$ that flows from node T of FIG. 5 through resistor Rs of FIG. 9, in response to the same slow rise of $V_{in}$.

FIG. 12 shows that the ratio of the cathode current flowing from FIG. 5's output node (through resistor R1) to the current $I_{out}$ flowing from node T of FIG. 5 (through resistor Rs) remains nearly constant for all values of input potential $V_{in}$. Thus, the current $I_{out}$ drawn from node T of FIG. 5 is accurately indicative of the cathode current flowing from FIG. 5's output node to the CRT display device to which it is coupled, just as the current $I_{out}$ drawn from node T of FIG. 1 is accurately indicative of the cathode current flowing from FIG. 1's output node to a CRT display device to which it is coupled. In contrast, since FIG. 11 shows that the ratio of the cathode current flowing from FIG. 3's output node (through resistor R1) to the current $I_{out}$ flowing from node T of FIG. 3 (through resistor Rs) depends on the value of input potential $V_{in}$, with the ratio being significantly greater for large values than for small values of potential $V_{in}$, the current $I_{out}$ drawn from node T of FIG. 3 is not accurately indicative of the cathode current flowing from FIG. 3's output node (through resistor R1) to the CRT display device to which it is coupled.

In a variation on the preferred embodiment of the invention described above with reference to FIGS. 5 and 6, an integrated circuit (which implements an amplifier and includes a gain-setting resistor) has a substrate of N-type semiconductor material. The resistor is formed (preferably as a strip of polysilicon, or multiple series-connected polysilicon segments) over a first tub of N-type semiconductor material in a second tub of P-type semiconductor material, where the second tub is formed in the N-type semiconductor substrate. The second tub forms the base of a vertical NPN bipolar transistor, and the first tub and substrate form the collector and emitter of such transistor.

It should be appreciated that in other embodiments of the invention, the resistor is formed over multiple tubs of semiconductor material (in accordance with the teaching of above-referenced U.S. Pat. No. 5,977,610), rather than over a single tub (e.g., tub 5 of FIG. 6). The multiple tubs of semiconductor material immediately underlying the resistor would be formed in a "second" tub of semiconductor material having the opposite polarity, the second tub would be formed in a substrate (having polarity opposite to that of the second tub), and the multiple tubs, second tub, and substrate would form the emitter, base, and collector of a vertical bipolar transistor.

Although preferred embodiments of the invention have been described as implementations of a gain-setting resistor RC2 of a high-speed cascode amplifier (of the type shown in FIG. 5), those of ordinary skill in the art will appreciate that alternative embodiments of the invention include implementations of gain-setting resistors of other high-speed amplifiers (implemented as integrated circuits or portions of integrated circuits) or resistors of integrated circuits which implement functions other than high-speed amplification. In each embodiment of the invention, a resistor a gain-setting resistor (preferably a strip of polysilicon, or multiple, series-connected polysilicon segments) formed over a first tub of semiconductor material of a first polarity (i.e., N-type or P-type material) in a second tub of semiconductor material having the opposite polarity, where the second tub of semiconductor material is formed in a semiconductor substrate having the first polarity. The second tub forms the base of a vertical bipolar transistor, and the first tub and substrate form the collector and emitter of such transistor. The resistor extends between a first node of the integrated circuit (whose potential typically varies in response to changes in an input signal) and a second node of the integrated circuit (whose potential varies in response to changes in the input signal). The resistor is preferably implemented with double bootstrapping, in the sense that the first tub is coupled to a third node of the integrated circuit whose potential changes (in response to a change in the input signal) in such a direction as to pull the potential at the second node in a desired direction and the second tub is coupled to a fourth node of the integrated circuit whose also potential changes (in response to a change in the input signal) in such a direction as to pull the potential at the second node in a desired direction, without significant current leakage from the first tub to the substrate.

Other integrated circuit amplifiers in which it is useful include the inventive resistor include inverting amplifiers having operational amplifiers. In variations on the FIG. S embodiment, resistor RC2 is implemented with more than two polysilicon strips (and/or portions of polysilicon strips connected by metal) deposited on a field oxide layer over a single tub (a first tub) of semiconductor material having a first polarity, where the first tub is formed in a second tub of semiconductor material having the opposite polarity. The polysilicon strips (or portions of strips between metal connectors) can, but need not, have identical length and resistance.

Although only one preferred embodiment has been described in detail (and alternative embodiments have also been described), those having ordinary skill in the art will appreciate that many modifications are possible without departing from the teachings set forth herein. All such modifications are intended to be encompassed within the following claims.

What is claimed is:

1. An integrated circuit configured to assert a first potential at a first node and a second potential at a second node in response to an input signal, wherein each of the first potential and the second potential changes in response to changes in the input signal, said circuit comprising:

a substrate of semiconductor material of a first polarity;

a vertical bipolar transistor having a base, an emitter, and a collector, wherein the collector is a portion of the substrate, a first tub of semiconductor material having the first polarity comprises the emitter, the first tub is formed in a second tub of semiconductor material comprising the base, and the second tub is formed in the substrate and has a second polarity opposite to the first polarity; and a resistor formed over the vertical bipolar transistor in a position at least partially overlying the first tub.

2. The integrated circuit of claim 1, wherein the vertical bipolar transistor is a vertical PNP transistor, and the first tub is composed of P-type semiconductor material.

3. The integrated circuit of claim 1, wherein the resistor extends between the first node and a third node of the integrated circuit, and the first tub is coupled to the second node thereby bootstrapping the first node toward a desired value of the second potential in response to each change in the input signal.

4. The integrated circuit of claim 3, wherein said integrated circuit is an amplifier having an output node, and the second node is said output node.

5. The integrated circuit of claim 1, wherein the resistor extends between the first node and a third node of the integrated circuit, the integrated circuit is configured to assert a third potential at a fourth node of said integrated circuit in response to the input signal, the third potential changes in response to changes in the input signal, and the first tub is coupled to the second node and the second tub is coupled to the fourth node, thereby bootstrapping the first node toward a desired value of the second potential in response to each change in the input signal and bootstrapping the second tub toward a desired value of the fourth potential in response to each change in the input signal with no more than an insignificant amount of current leakage from the first tub to the substrate.

6. The integrated circuit of claim 5, wherein the integrated circuit is an amplifier having an output node and a cascode Darlington push-pull output stage, the output stage includes a second bipolar transistor having a base, the resistor is a gain-setting resistor of the amplifier, the second node is the output node, and the fourth node is the base of the second bipolar transistor.

7. The integrated circuit of claim 6, wherein the vertical bipolar transistor is a vertical PNP transistor and the second bipolar transistor is an NPN bipolar transistor.

8. The integrated circuit of claim 1, wherein the resistor comprises at least one polysilicon segment.

9. The integrated circuit of claim 8, wherein the resistor comprises multiple polysilicon segments connected in series between the first node and a third node of the integrated circuit.

10. The integrated circuit of claim 1, wherein the integrated circuit is an amplifier, and the resistor is a gain-setting resistor of the amplifier.

11. The integrated circuit of claim 1, also including:

a field oxide layer which underlies the resistor and overlies portions of the substrate, the first tub, and the second tub.

12. The integrated circuit of claim 1, wherein the resistor overlies the first tub.

13. An integrated circuit including an amplifier configured to assert a first potential at a first node and an output potential at an output node in response to an input signal, wherein each of the first potential and the second potential changes in response to changes in the input signal, said circuit comprising:

a substrate of semiconductor material of a first polarity;

a vertical bipolar transistor having a base, an emitter, and a collector, wherein the collector is a portion of the substrate, a first tub of semiconductor material having the first polarity comprises the emitter, the first tub is formed in a second tub of semiconductor material comprising the base, and the second tub is formed in the substrate and has a second polarity opposite to the first polarity; and a resistor formed over the vertical bipolar transistor in a position at least partially overlying the first tub, wherein the resistor extends between the first node and a third node of the integrated circuit, and the first tub is coupled to the output node thereby bootstrapping the first node toward a desired value of the output potential in response to each change in the input signal.

14. The integrated circuit of claim 13, wherein the integrated circuit is configured to assert a second potential at a fourth node of said integrated circuit in response to the input signal, the second potential changes in response to changes in the input signal, the second tub is coupled to the fourth node, and the coupling of the first tub to the second node and the second tub to the fourth node bootstraps the first node toward a desired value of the output potential in response to each change in the input signal and bootstraps the second tub toward a desired value of the fourth potential in response to each change in the input signal with no more than an insignificant amount of current leakage from the first tub to the substrate.

15. The integrated circuit of claim 14, wherein the amplifier is a cascode amplifier having a cascode Darlington push-pull output stage, the output stage includes a second bipolar transistor having a base, the resistor is a gain-setting resistor of the amplifier, and the fourth node is the base of the second bipolar transistor.

16. The integrated circuit of claim 15, wherein the vertical bipolar transistor is a vertical PNP transistor and the second bipolar transistor is an NPN bipolar transistor.

17. The integrated circuit of claim 13, wherein the vertical bipolar transistor is a vertical PNP transistor, and the first tub is composed of P-type semiconductor material.

18. The integrated circuit of claim 13, wherein the resistor overlies the first tub.

19. The integrated circuit of claim 13, wherein the resistor comprises at least one polysilicon segment.

20. The integrated circuit of claim 19, wherein the resistor comprises multiple polysilicon segments connected in series between the first node and a third node of the integrated circuit.

21. The integrated circuit of claim 13, also including: a field oxide layer which underlies the resistor and overlies portions of the substrate, the first tub, and the second tub.

* * * * *